(12) United States Patent
Itakura (10) Patent No.: US 12,543,591 B2
(45) Date of Patent: Feb. 3, 2026

(54) SEMICONDUCTOR DEVICE AND SEMICONDUCTOR DEVICE MANUFACTURING METHOD

(71) Applicant: Kioxia Corporation, Tokyo (JP)

(72) Inventor: Satoru Itakura, Machida Tokyo (JP)

(73) Assignee: Kioxia Corporation, Tokyo (JP)

( * ) Notice: Subject to any disclaimer, the term of this patent is extended or adjusted under 35 U.S.C. 154(b) by 709 days.

(21) Appl. No.: 17/939,325

(22) Filed: Sep. 7, 2022

(65) Prior Publication Data

US 2023/0268310 A1 Aug. 24, 2023

(30) Foreign Application Priority Data

Feb. 21, 2022 (JP) ................. 2022-024647

(51) Int. Cl.
*H01L 23/00* (2006.01)
*H01L 21/56* (2006.01)
(Continued)

(52) U.S. Cl.
CPC ............ *H01L 24/32* (2013.01); *H01L 21/561* (2013.01); *H01L 21/563* (2013.01);
(Continued)

(58) Field of Classification Search
CPC ... H01L 21/561; H01L 21/563; H01L 21/568; H01L 21/6836; H01L 23/295; H01L 23/3121; H01L 23/315; H01L 24/29; H01L 24/48; H01L 24/73; H01L 24/83; H01L 24/95; H01L 25/0657; H01L 2221/68327; H01L 2221/68354; H01L 2221/68368; H01L 2224/2919; H01L 2224/3201; H01L 2224/32054; H01L 2224/32058; H01L 2224/32059; H01L 2224/32145; H01L 2224/32225; H01L 2224/48225; H01L 2224/73265; H01L 2224/83005; H01L 2224/83862; H01L 2224/95001; H01L 2225/0651; H01L 2225/06524; H01L 2225/06527; H01L 2225/06568;
(Continued)

(56) References Cited

U.S. PATENT DOCUMENTS 6,545,365 B2 * 4/2003 Kondo ................ H01L 25/0657
257/782
7,615,413 B2 * 11/2009 Yoshimura .............. H01L 24/27
257/778
(Continued)

FOREIGN PATENT DOCUMENTS

TW 202008529 A 2/2020
TW 202125651 A 7/2021

*Primary Examiner* — Vu A Vu
(74) *Attorney, Agent, or Firm* — Foley & Lardner LLP (57) ABSTRACT

According to one embodiment, a semiconductor device includes: a circuit board; a first semiconductor chip mounted on a face of the circuit board; a resin film covering the first semiconductor chip; and a second semiconductor chip having a chip area larger than a chip area of the first semiconductor chip, the second semiconductor chip being stuck to an upper face of the resin film and mounted on the circuit board. The resin film entirely fits within an inner region of a bottom face of the second semiconductor chip when viewed in a stacking direction of the first and second semiconductor chips.

20 Claims, 8 Drawing Sheets

(51) Int. Cl.
*H01L 21/683* (2006.01)
*H01L 23/29* (2006.01)
*H01L 23/31* (2006.01)
*H01L 25/065* (2023.01)

(52) U.S. Cl.
CPC ........ *H01L 21/568* (2013.01); *H01L 21/6836* (2013.01); *H01L 23/295* (2013.01); *H01L 23/3121* (2013.01); *H01L 23/315* (2013.01); *H01L 24/29* (2013.01); *H01L 24/48* (2013.01); *H01L 24/73* (2013.01); *H01L 24/83* (2013.01); *H01L 24/95* (2013.01); *H01L 25/0657* (2013.01); *H01L 2221/68327* (2013.01); *H01L 2221/68354* (2013.01); *H01L 2221/68368* (2013.01); *H01L 2224/2919* (2013.01); *H01L 2224/3201* (2013.01); *H01L 2224/32054* (2013.01); *H01L 2224/32058* (2013.01); *H01L 2224/32059* (2013.01); *H01L 2224/32145* (2013.01); *H01L 2224/32225* (2013.01); *H01L 2224/48225* (2013.01); *H01L 2224/73265* (2013.01); *H01L 2224/83005* (2013.01); *H01L 2224/83862* (2013.01); *H01L 2224/95001* (2013.01); *H01L 2225/0651* (2013.01); *H01L 2225/06524* (2013.01); *H01L 2225/06527* (2013.01); *H01L 2225/06568* (2013.01); *H01L 2924/1431* (2013.01); *H01L 2924/1438* (2013.01); *H01L 2924/1811* (2013.01); *H01L 2924/182* (2013.01); *H01L 2924/186* (2013.01)

(58) Field of Classification Search
CPC ....... H01L 2924/1431; H01L 2924/143; H01L 2924/1811; H01L 2924/182; H01L 2924/186; H01L 2225/06517; H01L 24/45; H01L 24/85; H01L 25/18; H01L 2225/06575; H01L 25/50; H01L 25/00; H05K 1/181; H05K 2201/10515; H05K 3/284; H05K 3/305; H05K 2201/2036; H05K 2203/049; H05K 1/141
USPC .......................................................... 257/723
See application file for complete search history.

(56) References Cited

U.S. PATENT DOCUMENTS

| | | | |
|---|---|---|---|
| 8,963,339 B2* | 2/2015 | He | H01L 25/50 257/E25.011 |
| 9,443,823 B2* | 9/2016 | Hatakeyama | H01L 21/561 |
| 9,825,006 B2* | 11/2017 | Miki | H01L 21/563 |
| 10,600,773 B2* | 3/2020 | Karakane | H01L 24/73 |
| 10,964,681 B2 | 3/2021 | Matsuura | |
| 12,062,647 B2* | 8/2024 | Lee | H01L 23/5389 |
| 2005/0026326 A1* | 2/2005 | Kiritani | H01L 24/81 257/E21.511 |
| 2006/0197260 A1 | 9/2006 | Yoshikawa et al. | |
| 2009/0085222 A1* | 4/2009 | Yamano | H01L 23/585 257/E23.116 |
| 2013/0071970 A1* | 3/2013 | Fujimoto | H01L 24/97 257/E21.599 |
| 2019/0164784 A1 | 5/2019 | Wongratanaporngoorn et al. | |
| 2020/0043907 A1 | 2/2020 | Matsuura | |
| 2020/0058510 A1 | 2/2020 | Yamada et al. | |
| 2022/0336281 A1 | 10/2022 | Tazawa et al. | |

\* cited by examiner

SEMICONDUCTOR DEVICE AND SEMICONDUCTOR DEVICE MANUFACTURING METHOD

CROSS-REFERENCE TO RELATED APPLICATIONS

This application is based upon and claims the benefit of priority from Japanese Patent Application No. 2022-024647, filed on Feb. 21, 2022; the entire contents of which are incorporated herein by reference.

FIELD

Embodiments described herein relate generally to a semiconductor device and a semiconductor device manufacturing method.

BACKGROUND

In a semiconductor device including a plurality of semiconductor chips mounted on a wiring board such as a printed circuit board, among the plurality of semiconductor chips, a small-sized semiconductor chip may be directly mounted on the wiring board, and a large-sized semiconductor chip may be stuck on top of the small-sized semiconductor chip with an adhesive resin film and thus mounted on the wiring board.

At this time, the resin film may protrude from an end of the large-sized semiconductor chip. Accordingly, the protruding resin film may interfere with the electrical connection between the semiconductor chip on a resin film and the wiring board, which may reduce the yield of the semiconductor device.

DETAILED DESCRIPTION

In general, according to one embodiment, a semiconductor device: a circuit board; a first semiconductor chip mounted on a face of the circuit board; a resin film covering the first semiconductor chip; and a second semiconductor chip having a chip area larger than a chip area of the first semiconductor chip, the second semiconductor chip being stuck to an upper face of the resin film and mounted on the circuit board. The resin film entirely fits within an inner region of a bottom face of the second semiconductor chip when viewed in a stacking direction of the first and second semiconductor chips.

Exemplary embodiments of the present invention will be explained below in detail with reference to the accompanying drawings. The present invention is not limited to the following embodiments. Also, the constituent elements in the following embodiments include ones easily conceived by those skilled in the art or substantially identical ones.

First Embodiment

Hereinbelow, a first embodiment will be explained in detail with reference to the drawings.

Configuration Example of Semiconductor Device

Figure 1A:
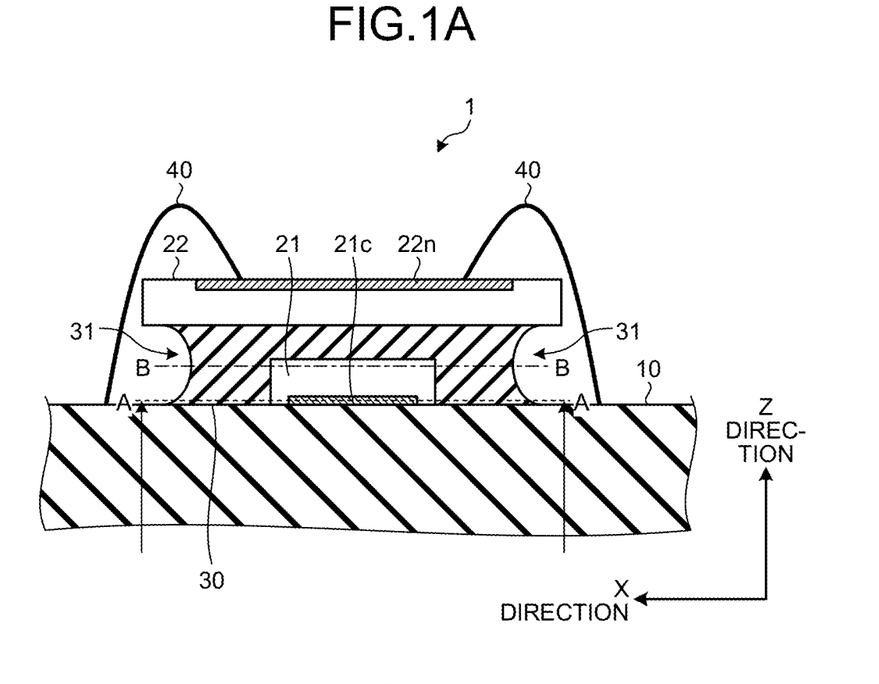
FIGS. 1A and 1B are diagrams illustrating an example of the configuration of a semiconductor device according to a first embodiment.
Figure 1B:
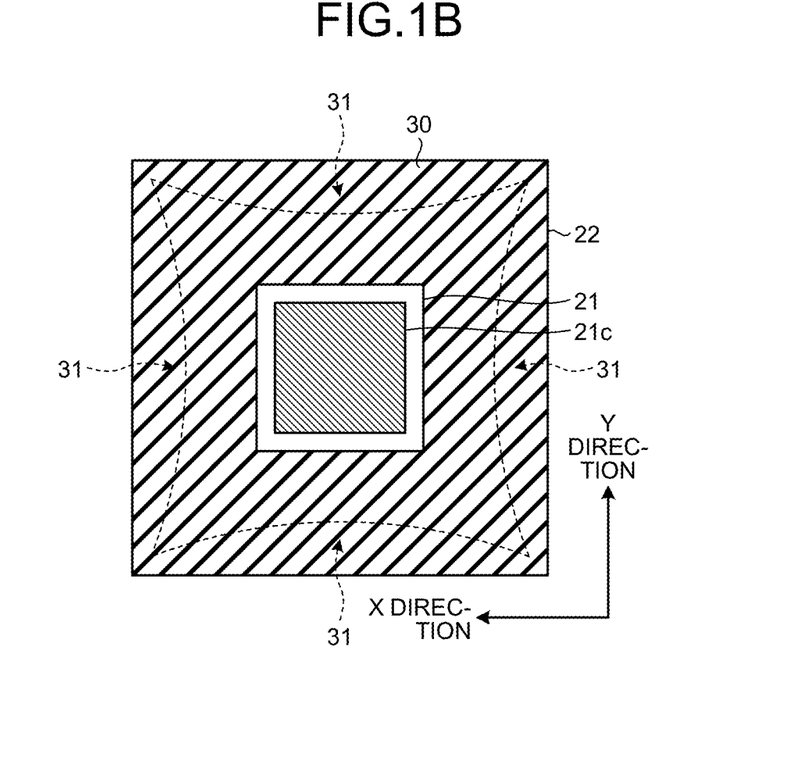

FIGS. 1A and 1B are diagrams illustrating an example of the configuration of a semiconductor device 1 according to the first embodiment. FIG. 1A is an XZ sectional view of the semiconductor device 1, and FIG. 1B is an XY sectional view of a semiconductor chip 21 included in the semiconductor device 1 taken along line A-A in FIG. 1A. In FIGS. 1A and 1B, an X direction, a Y direction, and a Z direction are perpendicular to each other.

Semiconductor chips 21 and 22 included in the semiconductor device 1 may have, for example, a substantially square shape when viewed in the Z direction corresponding to a stacking direction of the semiconductor chips 21 and 22, so that the YZ section of the semiconductor device 1 has a shape similar to the shape of the XZ section of FIG. 1A.

As illustrated in FIGS. 1A and 1B, the semiconductor device 1 is configured as, for example, a semiconductor package in which one or more semiconductor chips are encapsulated, and includes a printed circuit board 10, the semiconductor chips 21 and 22, a resin film 30, and a bonding wire 40.

The printed circuit board (PCB) 10 is configured as, for example, a multilayer board in which a plurality of insulating layers (not illustrated) and a plurality of conductive layers (not illustrated) are alternately stacked. For example, electrodes (not illustrated) are disposed on both faces of the printed circuit board 10.

The insulating layers are made of, for example, carbon fiber impregnated with an uncured thermosetting resin such as uncured epoxy resin, glass fiber, or aramid fiber. The conductive layers and the electrodes are made of, for example, metal such as copper. The electrode on one face of the printed circuit board 10 is electrically connected to the semiconductor chips 21 and 22. The electrode on the other face of the printed circuit board 10 is electrically connected to a host computer or the like through a mother board or the like.

Each of the semiconductor chips 21 and 22 is, for example, a small piece singulated from a silicon substrate or the like and has a semiconductor element on the surface thereof. For example, a nonvolatile memory 22n such as a NAND flash memory is mounted on the semiconductor chip 22 as the semiconductor element. The semiconductor chip 21 is, for example, singulated into a size smaller than the semiconductor chip 22, and a control circuit 21c such as a memory controller is mounted on the semiconductor chip 21 as the semiconductor element. The control circuit controls an electrical operation of the nonvolatile memory.

In this manner, the semiconductor device 1 may be configured as a memory system such as a solid state drive (SSD) including the nonvolatile memory 22n and the control circuit 21c.

The semiconductor chip 21 as the first semiconductor chip is, for example, directly disposed on the one face of the printed circuit board 10 with a face having the control circuit 21c facing the printed circuit board 10. The control circuit 21c and the electrode on the surface of the printed circuit board 10 are electrically connected to each other through, for example, a ball grid array (BGA) (not illustrated). Such a method for mounting the semiconductor chip 21 is also called a flip chip method.

However, the method for mounting the semiconductor chip 21 may be another method such as a wiring bonding method. When the semiconductor chip 21 is mounted on the printed circuit board 10 by the wire bonding method, the semiconductor chip 21 is disposed on the printed circuit board 10 with the face having the control circuit 21c facing upward, and the control circuit 21c and the electrode on the printed circuit board 10 are electrically connected to each other through, for example, a bonding wire. In this case, the entire bonding wire is preferably sealed inside the resin film 30 described below.

The resin film 30 is also called, for example, a die attach film (DAF) or a die bonding film (DBF) and made of, for example, a thermosetting adhesive formed in a film shape. The resin film 30 covers the entire semiconductor chip 21.

The semiconductor chip 22 as the second semiconductor chip is stuck on the resin film 30 with a face having the nonvolatile memory 22n facing opposite to the printed circuit board 10, that is, facing upward.

The semiconductor chip 22 is mounted on the printed circuit board 10, for example, by the wire bonding method. The nonvolatile memory 22n of the semiconductor chip 22 is electrically connected to the electrode on the upper face of the printed circuit board 10 through the bonding wire 40.

Such a mounting method in which, in the semiconductor device 1 including the plurality of semiconductor chips 21 and 22, one semiconductor chip, specifically, the semiconductor chip 22 is stuck on the printed circuit board 10 with the resin film 30 and the other semiconductor chip, specifically, the semiconductor chip 21 is embedded in the resin film 30 is also called film over die (FOD) mounting.

The semiconductor chip 22 has a chip area larger than the chip area of the semiconductor chip 21. When viewed in the stacking direction of the semiconductor chips 21 and 22, the semiconductor chip 21 and the resin film 30 covering the semiconductor chip 21 do not protrude from the bottom face of the semiconductor chip 22 and entirely fit within an inner region of the bottom face of the semiconductor chip 22.

More specifically, in sectional view of the semiconductor device 1, each side face of the resin film 30 in the thickness direction has, for example, a concave portion 31 recessed toward an inner region under the bottom face of the semiconductor chip 22. In this case, a recessed amount of the concave portion 31 is, for example, maximum near the center of a corresponding one of the four edges of the semiconductor chip 22 having a rectangular shape.

The XY sectional view of FIG. 1B illustrates a section taken along line A-A in FIG. 1A viewed in a direction away from the printed circuit board 10. In FIG. 1B, the concave portions 31 in a part having the maximum recessed amount on the side faces of the resin film 30 extending along the respective four edges of the semiconductor chip 22 are indicated by a broken line. In other words, an outline indicated by the broken line in FIG. 1B corresponds to the outer shape of the resin film 30 taken along line B-B in FIG. 1A.

While the resin film 30 has the concave portions 31 on the B-B section of FIG. 1A, an adhesive surface of the resin film 30 adhering to the bottom face of the semiconductor chip 22 expands to the entire bottom face of the semiconductor chip 22 as illustrated in FIG. 1B. That is, the resin film 30 covers the entire bottom face of the semiconductor chip 22 without protruding from the semiconductor chip 22.

However, the adhesive surface of the resin film 30 adhering to the bottom face of the semiconductor chip 22 may have a shape that is similar to the XY-sectional shape in the part having the concave portions 31 on the side faces of the resin film 30 and enlarged to the extent that the resin film 30 does not protrude from the semiconductor chip 22. Alternatively, the resin film 30 may partly protrude from the bottom face of the semiconductor chip 22 and partly climb up on the side face of the semiconductor chip 22.

Since the resin film 30 has the shape as described above, the volume of the resin film 30 can be represented by, for example, the following formula.

$$Vd_1 < Td \times An \quad (1)$$

$Vd_1$: the volume of the resin film 30

Td: the thickness of the resin film 30

An: the area of the bottom face of the semiconductor chip 22

In other words, the volume of the resin film 30 is, for example, smaller by the recessed amount of the concave portions 31 of the resin film 30 than a value obtained by multiplying the thickness of the resin film 30 by the area of the bottom face of the semiconductor chip 22.

Also, when viewed from above the semiconductor chip 22, an adhesive surface of the resin film 30 adhering to the circuit board 10 may be entirely located inside the semiconductor chip 22. The adhesive surface of the resin film 30 adhering to the printed circuit board 10 may have a shape that is similar to and larger than the XY-sectional shape in the part having the concave portions 31 on the side faces of the resin film 30. When viewed from above the semiconductor chip 22, the adhesive surface of the resin film 30 adhering to the circuit board 10 may partly protrude from the semiconductor chip 22.

(Method for Manufacturing Semiconductor Device)

Next, a method for manufacturing the semiconductor device 1 of the first embodiment will be explained with reference to FIGS. 2A to 3C. FIGS. 2A to 3C are sectional views in the X direction or the Y direction illustrating, as an example, some of the steps of the method for manufacturing the semiconductor device 1 according to the first embodiment in order.

Figure 2A:
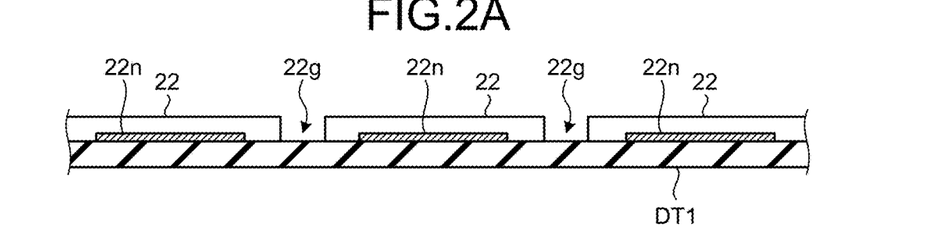
FIGS. 2A to 2D are sectional views in an X direction or a Y direction illustrating, as an example, some of the steps of a method for manufacturing the semiconductor device according to the first embodiment in order.

As illustrated in FIG. 2A, a plurality of singulated semiconductor chips 22 on each of which the nonvolatile memory 22n is formed are arranged in the X direction and the Y direction and stuck to a dicing tape DT1.

At this time, each of the semiconductor chips 22 is stuck with the face having the nonvolatile memory 22n facing the dicing tape DT1. In each boundary portion 22g between the semiconductor chips 22, the adjacent semiconductor chips 22 are arrayed with a predetermined spacing therebetween in the X direction or the Y direction.

Figure 2B:
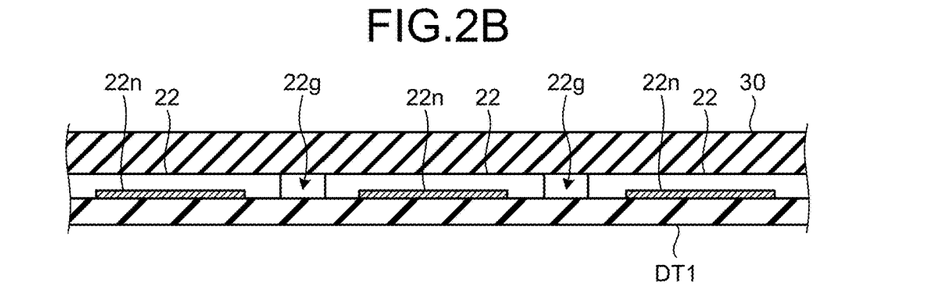

As illustrated in FIG. 2B, the resin film 30 is stuck on the upper faces of the plurality of semiconductor chips 22, that is, on the faces opposite to the nonvolatile memories 22n. The resin film 30 is stuck across the plurality of semiconductor chips 22 including the boundary portions 22g therebetween so as to cover these semiconductor chips 22 in their entirety. At this time, the resin film 30 is in an uncured state having adhesiveness and temporarily fixed to the plurality of semiconductor chips 22.

Figure 2C:
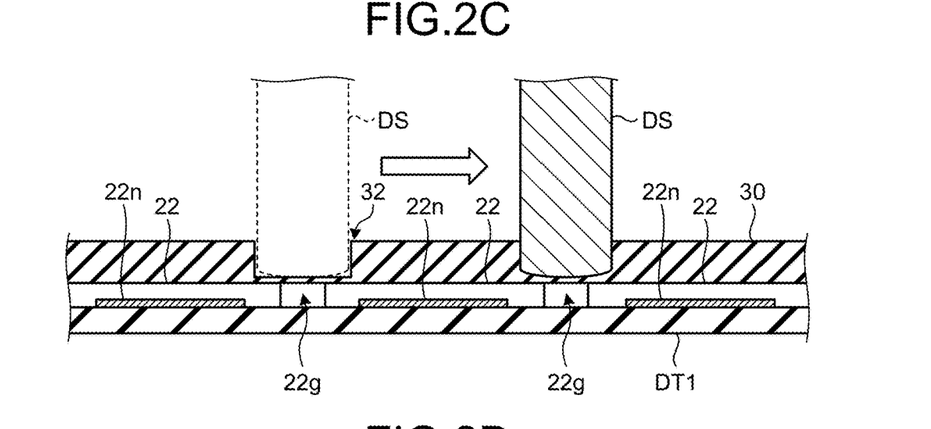

As illustrated in FIG. 2C, a dicing saw DS wider than the spacing between the semiconductor chips 22 is pressed against the resin film 30 at each position corresponding to the boundary portion 22g between the semiconductor chips 22 from the side opposite to the dicing tape DT1 to cut the resin film 30 at the positions overlapping the boundary portions 22g between the semiconductor chips 22 at a predetermined depth in the X direction and the Y direction using the dicing saw DS.

Accordingly, a plurality of cuts 32 extending in the X direction and the Y direction are formed on the resin film 30 at the positions overlapping the boundary portions 22g between the semiconductor chips 22.

Each of the cuts 32 as a plurality of first cuts has a width larger than the spacing between the semiconductor chips 22 and a predetermined depth, and does not penetrate the resin film 30 in the thickness direction. Thus, a thin film of the resin film 30 remains on the bottom of each of the cuts 32.

The plurality of cuts 32 of the resin film 30 may be formed by, for example, irradiation of laser light instead of using the dicing saw DS. Also in this case, for example, the depth of focus of the laser light is adjusted so that the resin film 30 is not completely cut into pieces.

Figure 2D:
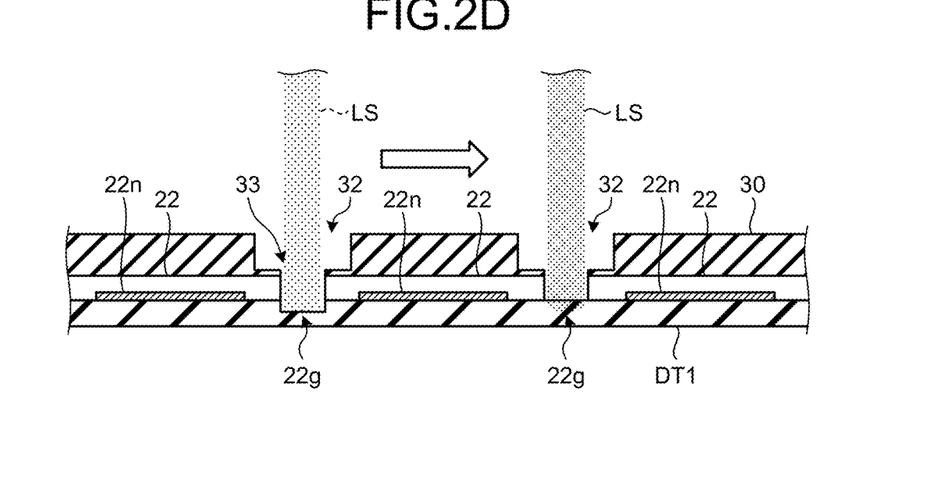

As illustrated in FIG. 2D, the thin film of the resin film 30 remaining on the bottom of each of the cuts 32 is cut by using, for example, laser light LS. At this time, an irradiation width of the laser light LS is set to, for example, a width substantially equal to the spacing between the semiconductor chips 22. Also, the depth of focus of the laser light LS is adjusted so that the dicing tape DT1 is not cut into pieces when the resin film 30 is cut.

Accordingly, a plurality of cuts 33 extending in the X direction and the Y direction are formed on the resin film 30 at positions overlapping the boundary portions 22g between the semiconductor chips 22 on the bottoms of the cuts 32.

Each of the cuts 33 as a plurality of second cuts has a width substantially equal to the spacing between the semiconductor chips 22 and penetrates the resin film 30. Accordingly, the resin film 30 is cut for each of the semiconductor chips 22.

Figure 3A:
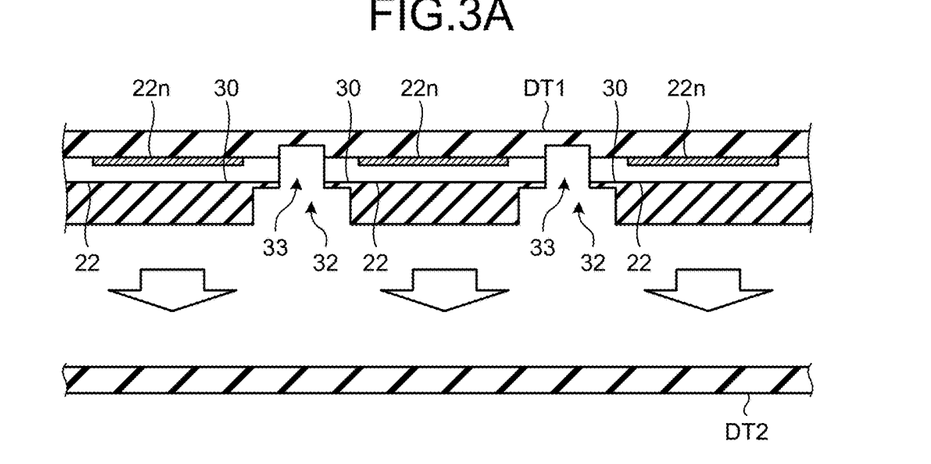
FIGS. 3A to 3C are sectional views in the X direction or the Y direction illustrating, as an example, some of the steps of the method for manufacturing the semiconductor device according to the first embodiment in order.

As illustrated in FIG. 3A, the resin film 30 and the semiconductor chips 22 processed as described above are transferred onto another dicing tape DT2.

More specifically, the resin film 30 and the semiconductor chip 22 stuck to the dicing tape DT1 are allowed to face the dicing tape DT2 with the resin film 30 facing the dicing tape DT2.

Figure 3B:
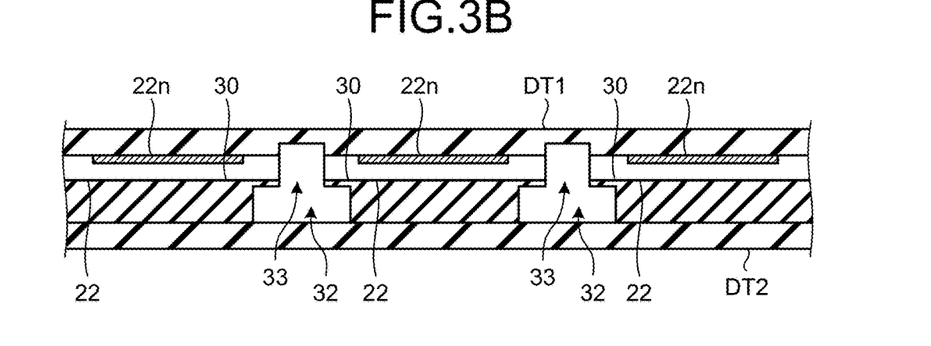

As illustrated in FIG. 3B, the resin film 30 and the dicing tape DT2 are stuck together, so that the resin film 30 and the semiconductor chips 22 kept stuck to the dicing tape DT1 are stuck to the dicing tape DT2. Also at this time, the adhesion between the resin film 30 and the dicing tape DT2 is in a temporarily fixed state.

Figure 3C:
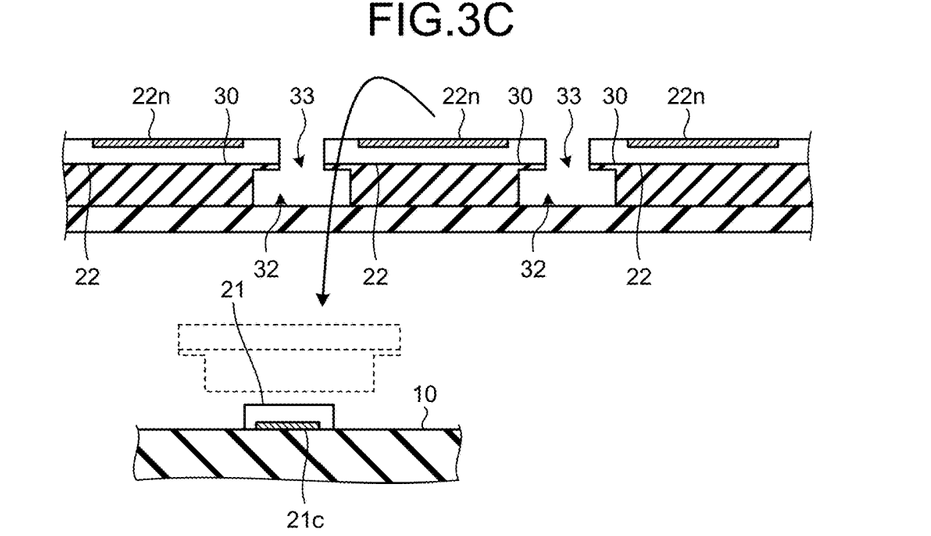

As illustrated in FIG. 3C, the dicing tape DT1 stuck to the semiconductor chips 22 is peeled off, and the semiconductor chips 22 transferred onto the dicing tape DT2 are picked up by a picker or the like and mounted on the printed circuit board 10.

The control circuits 21c are previously formed on the printed circuit board 10, and the singulated semiconductor chips 21 are mounted thereon by the flip chip method or the like. After that, each of the semiconductor chips 22 is placed on the printed circuit board 10 at a position overlapping the semiconductor chip 21 when viewed in the stacking direction of the semiconductor chips 21 and 22 with the resin film 30 facing the semiconductor chip 21. Also at this time, the resin film 30 is temporarily fixed to the semiconductor chip 21.

Thereafter, the resin film 30 is heated in a state where the semiconductor chip 22 is placed on the semiconductor chip 21 on the printed circuit board 10 with the resin film 30 facing down. As described above, for example, a thermosetting adhesive is used as the resin film 30. Thus, the resin film 30 is once softened by heat and firmly sticks to the semiconductor chips 21 and 22, and is then cured while maintaining the firm adhesion state.

Also, the resin film 30 once softened by heat comes into intimate contact with not only the upper face of the semiconductor chip 21, but also the side faces thereof, and the entire semiconductor chip 21 is covered with the resin film 30. At this time, the linear sectional shape of the cut 32 on each side face of the resin film 30 also changes due to the softening, and the resin film 30 is formed into, for example, a shape having the concave portions 31 on the side faces as illustrated in FIGS. 1A and 1B described above.

Such concave portions 31 are formed on the side faces due to, for example, the surface tension of the softened resin film 30. Also, as illustrated in FIG. 1B, the recessed amount of each of the concave portions 31 on the side faces of the resin film 30 is, for example, maximum near the center of the corresponding one of the four edges of the semiconductor chip 22 due to, for example, the surface tension of the softened resin film 30.

In this manner, each of the concave portions 31 can have the maximum recessed amount at the thickness-direction center of the resin film 30 and the width-direction center along the edge of the semiconductor chip 22 due to, for example, the surface tension of the softened resin film 30. On the other hand, on the adhesive surface adhering to the bottom face of the semiconductor chip 22, the thin film of the resin film 30 remaining on the bottom of the cut 32 remains as it is, and, for example, a state in which the entire bottom face of the semiconductor chip 22 is covered is maintained.

However, for example, the thin film part of the resin film 30 remaining on the bottom of the cut 32 may also move back toward the inner region of the semiconductor chip 22 with the formation of the concave portions 31 on the side faces of the resin film 30.

In this case, as described above, on the bottom face of the semiconductor chip 22, the shape of the adhesive surface of the resin film 30 may become the shape similar to the shape in the part having the concave portions 31 on the side faces of the resin film 30. Also in this case, some kind of trace such as an ingredient of the resin film 30 that covers the entire bottom face of the semiconductor chip 22 before heat curing may remain on the bottom face of the semiconductor chip 22.

Thereafter, the semiconductor chip 22 and the electrode of the printed circuit board 10 are connected to each other through the bonding wire 40, and the semiconductor chip 22 is mounted on the printed circuit board 10.

In this manner, the semiconductor device 1 of the first embodiment is manufactured.

Comparative Example

Figure 4A:
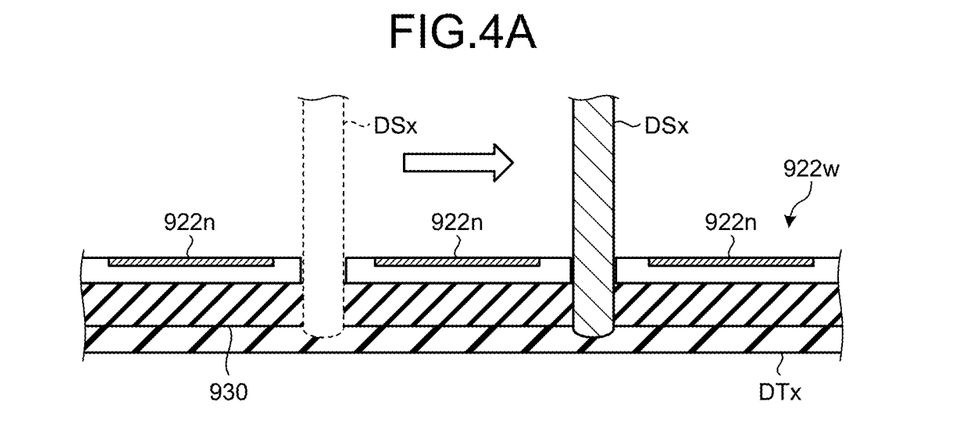
FIGS. 4A to 4C are diagrams illustrating a manufacturing method example and a configuration example of a semiconductor device according to a comparative example.
Figure 4B:
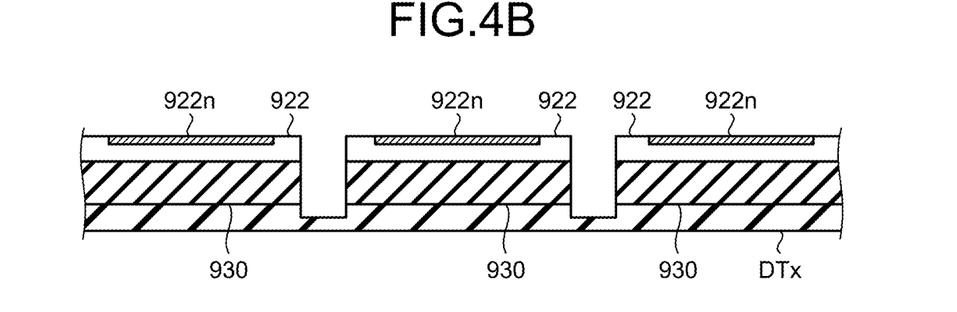
Figure 4C:
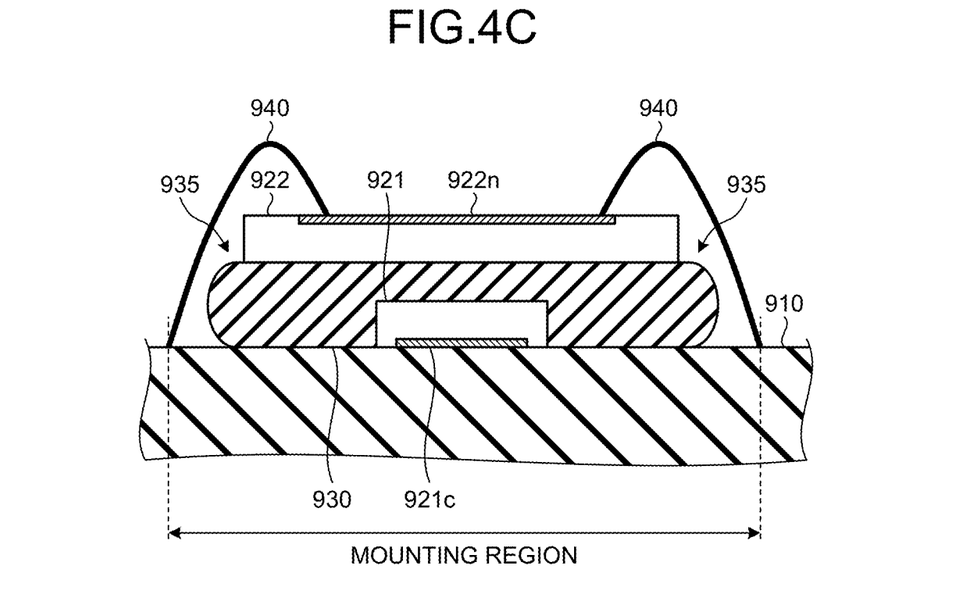

Next, a semiconductor device of a comparative example will be explained with reference to FIGS. 4A to 4C. FIGS. 4A to 4C are diagrams illustrating a manufacturing method example and a configuration example of the semiconductor device according to the comparative example.

As illustrated in FIG. 4A, in a process of manufacturing the semiconductor device of the comparative example, for example, a resin film 930 is stuck to a dicing tape DTx, and an unsingulated substrate 922w such as an unsingulated silicon substrate is stuck to the upper face of the resin film 930.

For example, nonvolatile memories 922n are already formed on the surface of the substrate 922w. The substrate 922w is stuck to the resin film 930 with a face having the nonvolatile memories 922n facing upward.

Further, the resin film 930 and the substrate 922w stuck to the dicing tape DTx are cut and singulated by a dicing saw DSx having a predetermined width.

As illustrated in FIG. 4B, after the singulation using the dicing saw DSx, a plurality of semiconductor chips 922 and the resin film 930 cut for each of the semiconductor chips 922 are placed on the dicing tape DTx.

At this time, when viewed in the stacking direction of the semiconductor chip 922 and the resin film 930, each resin film 930 has an area substantially equal to the chip area of the corresponding semiconductor chip 922. Also, the resin film 930 has side faces each having a substantially linear sectional shape at positions substantially corresponding to the edges of the semiconductor chip 922 when viewed in the stacking direction of the semiconductor chip 922 and the resin film 930.

Thereafter, the resin film 930 and the semiconductor chip 922 processed as described above are placed on a semiconductor chip 921 that has a control circuit 921c and is already mounted on the printed circuit board 910 to mount the semiconductor chip 922 on the printed circuit board 910.

As illustrated in FIG. 4C, the semiconductor device that has undergone the manufacturing process described above may have the resin film 930 protruding from the bottom face of the semiconductor chip 922. The resin film 930 has convex portions 935 bulging outward from the semiconductor chip 922. Such convex portions 935 are formed on the side faces of the resin film 930, for example, because, in heat-curing the resin film 930, the softened resin film 30 is pushed outward by the volume of the semiconductor chip 921, and surface tension acts on the resin film 930.

In such a case, the resin film 930 protruding from the semiconductor chip 922 may interfere with joining between the bonding wire 940, and the semiconductor chip 922 and the printed circuit board 910, which may reduce the yield of the semiconductor device of the comparative example.

Also, in the case as described above, the bonding wire 940 that connects the semiconductor chip 922 and the printed circuit board 910 to each other is connected to the printed circuit board 910 at a position more distant from the semiconductor chip 922 so as to avoid the resin film 930 having the convex portions 935.

This may expand a mounting region of the semiconductor chips 921 and 922 on the printed circuit board 910 as a whole. That is, a wider substantial mounting area including the bonding wire 940 needs to be secured on the printed circuit board 910. Also, since the bonding wire 940 is connected at the position more distant from the semiconductor chip 922, the total length of the bonding wire 940 increases, which may result in deterioration in the characteristics of the semiconductor device of the comparative example, such as reduction in the operation speed of the nonvolatile memory 922n.

According to the semiconductor device 1 of the first embodiment, the resin film 30 entirely fits within the inner region of the bottom face of the semiconductor chip 22 when viewed in the stacking direction of the semiconductor chips 21 and 22. Such a semiconductor device 1 is formed, for example, by forming the cut 32 having the width larger than the predetermined spacing between the semiconductor chips 22 and the predetermined depth on the resin film 30 at the position corresponding to each boundary portion 22g between the semiconductor chips 22.

Accordingly, it is possible to reduce a joining failure between the bonding wire 40, and the semiconductor chip 22 and the printed circuit board 10 and improve the yield of the semiconductor device 1.

Also, in connecting the bonding wire 40 to the printed circuit board 10, the bonding wire 40 can be connected to a position closer to the semiconductor chip 22. Thus, it is possible to reduce the substantial mounting area of the semiconductor chips 21 and 22 on the printed circuit board 10. Therefore, the degree of integration of the semiconductor chips 21 and 22 and the like on the printed circuit board 10 can be increased. Furthermore, the total length of the bonding wire 40 is reduced, which makes it possible to increase the operation speed of the nonvolatile memory 22 and improve the characteristics of the semiconductor device 1.

According to the method for manufacturing the semiconductor device 1 of the first embodiment, the cut 32 having the width larger than the predetermined spacing between the semiconductor chips 22 and the predetermined depth is formed on the resin film 30, and the cut 33 having the width substantially equal to the predetermined spacing between the semiconductor chips 22 is formed on the resin film 30 remaining on the bottom of the cut 32 to cut the resin film 30 in the thickness direction.

In this manner, in forming the cut 32, the resin film 30 is cut not at once, but in two stages. Thus, in forming the cut 32, damage of the semiconductor chip 22 can be reduced.

According to the method for manufacturing the semiconductor device 1 of the first embodiment, the dicing saw DS is used to form the cut 32. Accordingly, the plurality of long cuts 32 extending across the plurality of semiconductor chips 22 can be promptly formed.

According to the method for manufacturing the semiconductor device 1 of the first embodiment, the laser light LS is used to form the cut 33. Accordingly, it is possible to process the resin film 30 with higher accuracy than using, for example, the dicing saw DS, and cut the resin film 30 into a size substantially equal to the size of the bottom face of the semiconductor chip 22 without protrusion of the resin film 30 from each semiconductor chip 22. Also, in cutting the resin film 30, damage of the semiconductor chip 22 can be reduced.

According to the method for manufacturing the semiconductor device 1 of the first embodiment, the resin film 30 having the cuts 32 and 33 is stuck to the dicing tape DT2 different from the dicing tape DT1, and the semiconductor chip 22 is transferred onto the dicing tape DT2 from the dicing tape DT1. This enables the use of a picker or the like in mounting the semiconductor chip 22 on the printed circuit board 10, achieves easy handling of the semiconductor chip 22, and achieves efficient mounting of the semiconductor chip 22 on the printed circuit board 10.

(First Modification)

Next, a semiconductor device 1a of a first modification of the first embodiment will be explained with reference to FIGS. 5A to 5C. The semiconductor device 1a of the first modification differs from the first embodiment in that semiconductor chips 121 and 122 have a rectangular shape when viewed in the Z direction corresponding to the stacking direction of the semiconductor chips 121 and 122.

Figure 5A:
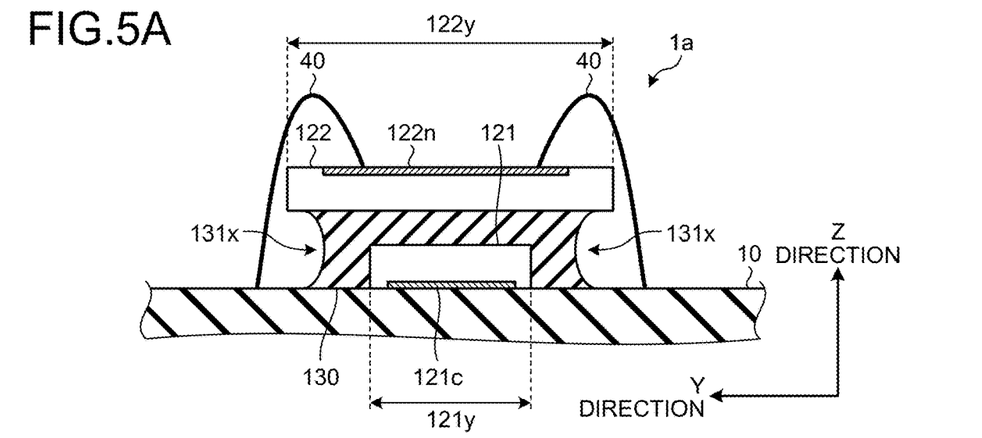
FIGS. 5A to 5C are diagrams illustrating an example of the configuration of a semiconductor device according to a first modification of the first embodiment.
Figure 5B:
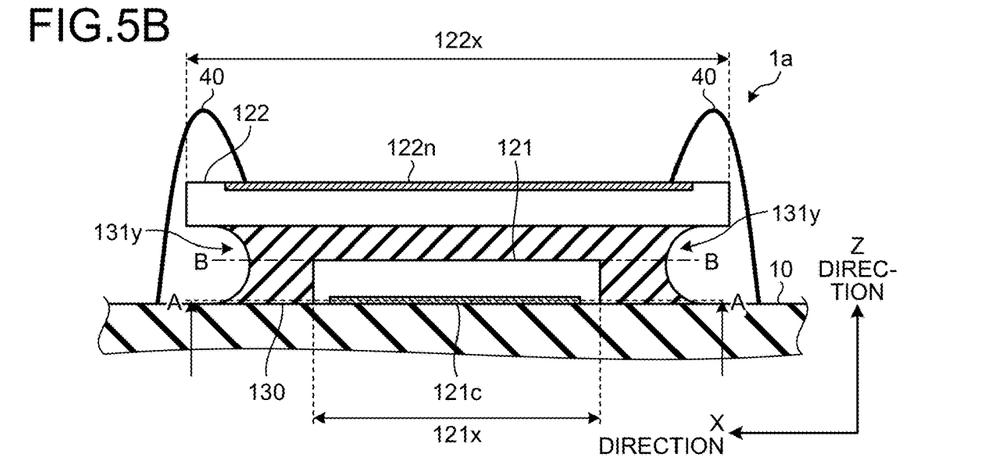
Figure 5C:
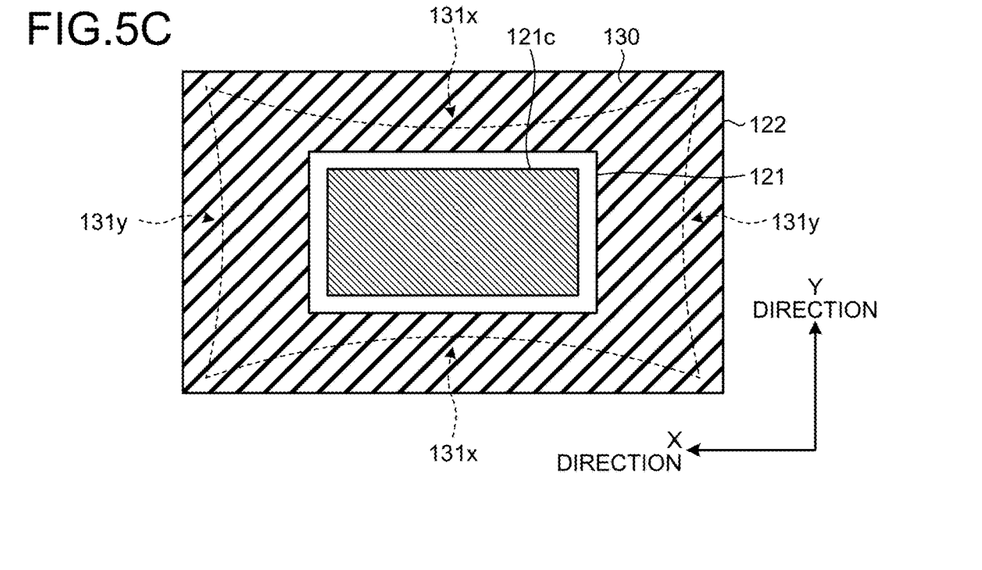

FIGS. 5A to 5C are diagrams illustrating an example of the configuration of the semiconductor device 1a according to the first modification of the first embodiment. FIG. 5A is a YZ sectional view of the semiconductor device 1a, FIG. 5B is an XZ sectional view of the semiconductor device 1a, and FIG. 5C is an XY sectional view of the semiconductor device 1a taken along line A-A in FIG. 5A. Note that, as with FIG. 1 of the first embodiment described above, the outer shape of a resin film 130 on the section taken along line B-B in FIG. 5A is indicated by a broken line in FIG. 5C.

Also, like reference signs designate components similar to those of the first embodiment, and description thereof may be omitted.

As illustrated in FIGS. 5A to 5C, the semiconductor device 1a of the first modification includes the semiconductor chips 121 and 122 instead of the semiconductor chips 21 and 22 of the first embodiment. While the semiconductor chips 21 and 22 of the first embodiment have a substantially square shape when viewed in the Z direction, the semiconductor chips 121 and 122 of the first modification have, for example, a rectangular shape when viewed in the Z direction.

The semiconductor chip 122 as the second semiconductor chip, for example, includes a nonvolatile memory 122n on one face, and has an edge 122y as a first edge that extends in the Y direction and an edge 122x as a second edge that extends in the X direction and is longer than the edge 122y extending in the Y direction. That is, the edge 122y corresponds to the short side of the semiconductor chip 122 having a rectangular shape, and the edge 122x corresponds to the long side thereof.

The semiconductor chip 121 as the second semiconductor chip, for example, includes a control circuit 121c on one face, and has an edge 121y that extends in the Y direction and an edge 121x that extends in the X direction and is longer than the edge 121y extending in the Y direction. That is, the edge 121y corresponds to the short side of the semiconductor chip 121 having a rectangular shape, and the edge 121x corresponds to the long side thereof.

When the semiconductor chips 121 and 122 to be mounted have a rectangular shape in this manner, the shape of the resin film 130 that covers the semiconductor chip 121 with the semiconductor chip 122 stuck to the upper face of the resin film 130 may differ from the shape of the resin film 30 of the first embodiment described above.

Specifically, for example, a concave portion 131x as a second concave portion on the side face of the resin film 130 extending along the edge 122x, which is the long side of the semiconductor chip 122, may have a larger recessed amount than a concave portion 131y as a first concave portion on the side face of the resin film 130 extending along the edge 122y, which is the short side of the semiconductor chip 122.

This is because the influence of surface tension appears more apparent on the side face of the resin film 130 that extends along the long side of the semiconductor chip 122 and has a larger surface area than on the side face of the resin film 130 that extends along the short side of the semiconductor chip 122 and has a relatively small surface area.

(Second Modification)

Next, a semiconductor device of a second modification of the first embodiment will be explained with reference to FIGS. 6A and 6B. The semiconductor device of the second modification differs from the first modification described above in that a cut amount into a resin film 230 is changed between the X direction and the Y direction in a manufacturing process thereof.

Figure 6A:
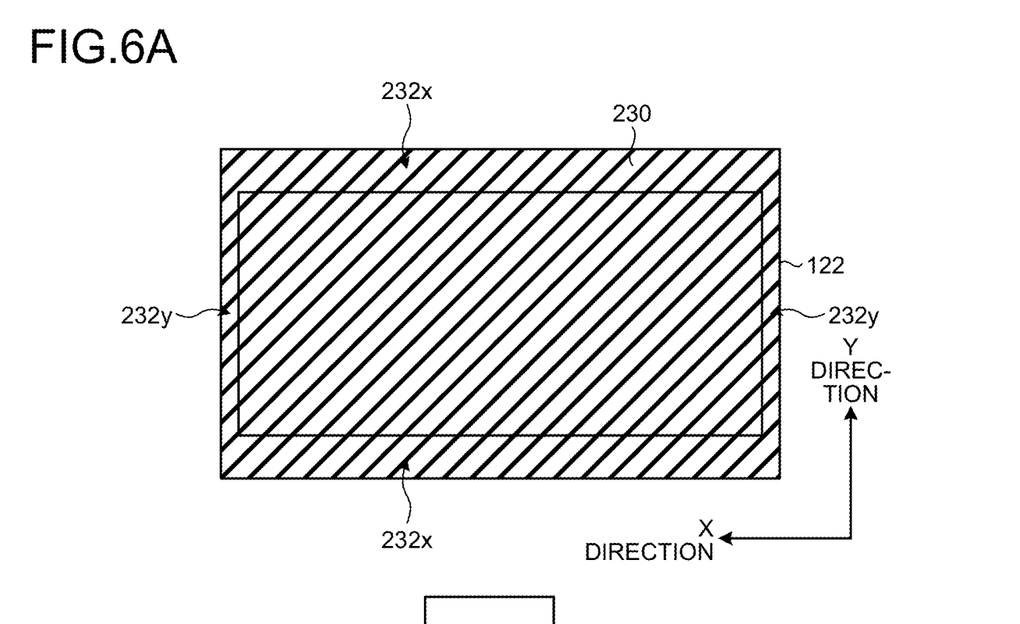
FIGS. 6A and 6B are XY sectional views illustrating, as an example, some of the steps of a method for manufacturing a semiconductor device according to a second modification of the first embodiment in order.
Figure 6B:
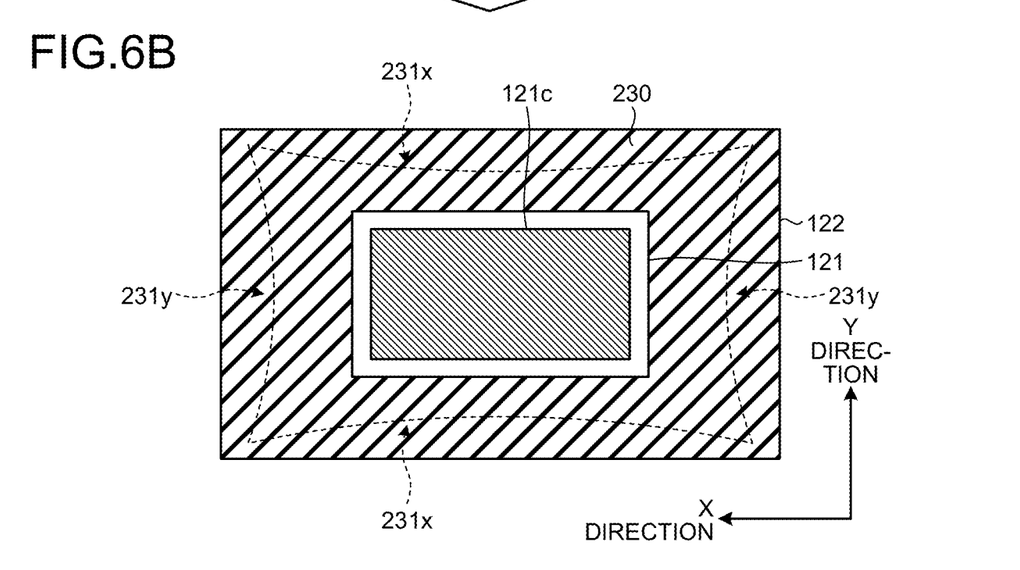

FIGS. 6A and 6B are XY sectional views illustrating, as an example, some of the steps of a method for manufacturing the semiconductor device according to the second modification of the first embodiment in order. In FIGS. 6A and 6B, like reference signs designate components similar to those of the first modification, and description thereof may be omitted.

FIG. 6A is an XY sectional view between the semiconductor chips 121 and 122 at a position near the lower face of the semiconductor chip 121 that has undergone the manufacturing steps corresponding to FIGS. 2A to 2D described above.

As illustrated in FIGS. 6A, on the resin film 230, a cut 232x extending along the long side of the semiconductor chip 122 and a cut 232y extending along the short side of the semiconductor chip 122 are formed. These cuts 232x and 232y have different widths.

The width of the cut 232x in the Y direction is larger than the width of the cut 232y in the X direction. Such cuts 232x and 232y are formed, for example, by using a thick dicing saw to form the cut 232x and using a thin dicing saw to form the cut 232y.

That is, a cut having a width larger than the spacing between the semiconductor chips 122 is formed on the resin film 230 at a position corresponding to a boundary portion where the semiconductor chips 122 stuck on the dicing tape are adjacent to each other at the short-side edges 122y. This cut serves as the cut 232y after the resin film 230 is cut for each of the semiconductor chips 122.

Also, a cut having a width larger than the above-mentioned cut on the short side of the semiconductor chip 122 is formed on the resin film 230 at a position corresponding to a boundary portion where the semiconductor chips 122 stuck on the dicing tape are adjacent to each other at the long-side edges 122x. This cut serves as the cut 232x after the resin film 230 is cut for each of the semiconductor chips 122.

The two types of cuts having different widths may have substantially the same depth in the thickness direction of the resin film 230.

FIG. 6B is an XY sectional view after the resin film 230 and the semiconductor chip 122 processed as described above are placed on the printed circuit board, and the resin film 230 is heat-cured. The section indicated by a solid line in FIG. 6B corresponds to the section indicated by a solid line in FIG. 5C of the first modification described above. The section indicated by a broken line in FIG. 6B corresponds to the section indicated by a broken line in FIG. 5C of the first modification described above.

As illustrated in FIG. 6B, the resin film 230 has a shape having concave portions 231x and 231y on the side faces thereof due to heat curing. The concave portion 231x is formed on each side face of the resin film 230 extending along the long side of the semiconductor chip 122. The concave portion 231y is formed on each side face of the resin film 230 extending along the short side of the semiconductor chip 122.

The concave portion 231x has a maximum recessed amount near the center of the edge corresponding to the long side of the semiconductor chip 122, and the concave portion 231y has a maximum recessed amount near the center of the edge corresponding to the short side of the semiconductor chip 122. The maximum recessed amount of the concave portion 231x and the maximum recessed amount of the concave portion 231y are substantially equal to each other. That is, the recessed amount of the concave portion 231x in the Y direction and the recessed amount of the concave portion 231y in the X direction are substantially equal to each other. This is because the cuts 232x and 232y having different widths are formed on the resin film 230.

In heat-curing the resin film 230, in the softened resin film 230, only a small surface tension acts on the side face of the resin film 230 extending along the short side of the semiconductor chip 122 and having a small surface area.

However, since the width of the cut 232y is reduced, the distance from the side face of the resin film 230 extending along the short side of the semiconductor chip 122 to the edge of the semiconductor chip 121 embedded in the resin film 230 increases. This reduces the influence caused by the semiconductor chip 121 pushing a part of the resin film 230 outward in the X direction.

Thus, as a result, the recessed amount of the concave portion 231y, for example, becomes larger than the recessed amount of the concave portion 131y of the first modification described above.

In heat-curing the resin film 230, in the softened resin film 230, a large surface tension acts on the side face of the resin film 230 extending along the long side of the semiconductor chip 122 and having a large surface area.

However, since the width of the cut 232x is increased, the distance from the side face of the resin film 230 extending along the long side of the semiconductor chip 122 to the edge of the semiconductor chip 121 embedded in the resin film 230 decreases. This increases the influence caused by the semiconductor chip 121 pushing a part of the resin film 230 outward in the Y direction.

Thus, as a result, the recessed amount of the concave portion 231x, for example, becomes smaller than the recessed amount of the concave portion 131x of the first modification described above.

According to the method for manufacturing the semiconductor device of the second modification, on the resin film 230, the cut that has a width larger than the predetermined spacing between the semiconductor chips 122 and serves as the cut 232y later is formed, and the cut that has a width larger than the width of the above-mentioned cut and serves as the cut 232x later is formed.

This can reduce the difference between the maximum recessed amounts of the concave portions 231x and 231y of the heat-cured resin film 230. Thus, it is possible to more reliably prevent protrusion of the resin film 230 from the semiconductor chip 122.

The method for manufacturing the semiconductor device of the second modification achieves effects similar to the effects achieved by the semiconductor device 1 and the manufacturing method thereof of the first embodiment described above.

In the second modification, both of the semiconductor chips 121 and 122 have a rectangular shape. However, the configuration of the second modification is applicable to a combination of semiconductor chips other than the above. That is, when at least the semiconductor chip on the resin film or the semiconductor chip embedded in the resin film has a rectangular shape, the cut amount of the resin film can be appropriately changed between the X direction and the Y direction.

(Third Modification)

Even when components substantially similar to those of the semiconductor device 1 of the first embodiment are used, and manufacture is performed by a manufacturing method substantially similar to that for the semiconductor device 1 of the first embodiment, the resin film included in the semiconductor device may have various shapes.

Figure 7:
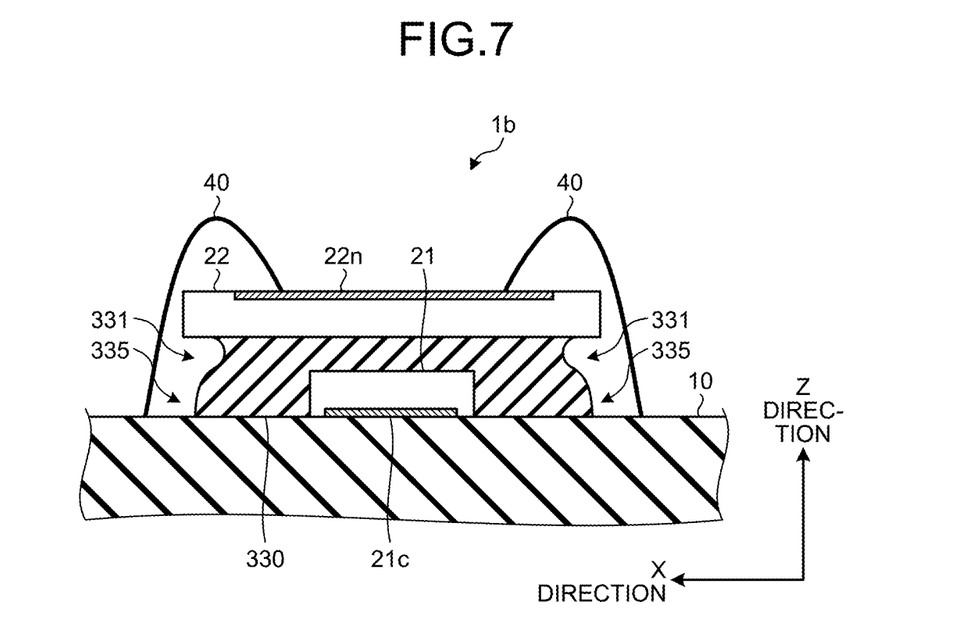
FIG. 7 is an XZ sectional view illustrating an example of the configuration of a semiconductor device according to a third modification of the first embodiment.

The shape of the resin film may change due to various factors such as the size of each semiconductor chip, the surface property of the printed circuit board, the amount of the resin film used, a heating temperature, a heating time, and temperature and humidity at the time of manufacture. FIG. 7 illustrates an example of a resin film 330 having a shape different from that of the first embodiment described above.

FIG. 7 is an XZ sectional view illustrating an example of the configuration of a semiconductor device 1b according to a third modification of the first embodiment. In FIG. 7, like reference signs designate components similar to those of the first embodiment, and description thereof may be omitted.

The semiconductor chips 21 and 22 may have, for example, a substantially square shape when viewed in the Z direction, so that the YZ section of the semiconductor device 1b has a shape similar to the shape of the XZ section illustrated in FIG. 7.

As illustrated in FIG. 7, the resin film 330 included in the semiconductor device 1b has a concave portion 331 and a convex portion 335 on each side face thereof.

For example, the concave portion 331 of the resin film 330 is located directly under the bottom face of the semiconductor chip 22 and has a shape recessed toward the inner region under the bottom face of the semiconductor chip 22 in sectional view of the semiconductor device 1b.

The convex portion 335 of the resin film 330 is located under the concave portion 330 at a height where the semiconductor chip 21 is disposed. The convex portion 335 has a shape projecting toward an outer region of the semiconductor chip 22 to the extent that the convex portion 335 does not protrude from the semiconductor chip 22 when viewed in the cross section of the semiconductor device 1b.

The resin film 330 has the shape as described above, for example, when an ejection amount of the resin film 330 ejected by the semiconductor chip 21 is large or when an ejection force applied to the resin film 330 by the semiconductor chip 21 is strong.

Second Embodiment

Hereinbelow, a second embodiment will be explained in detail with reference to the drawings. A semiconductor device of the second embodiment differs from the first embodiment described above in that a recessed portion is provided on a resin film at a position where a semiconductor chip is embedded. Hereinbelow, like reference signs designate components similar to those of the first embodiment, and description thereof may be omitted.

Configuration Example of Semiconductor Device

Figure 8:
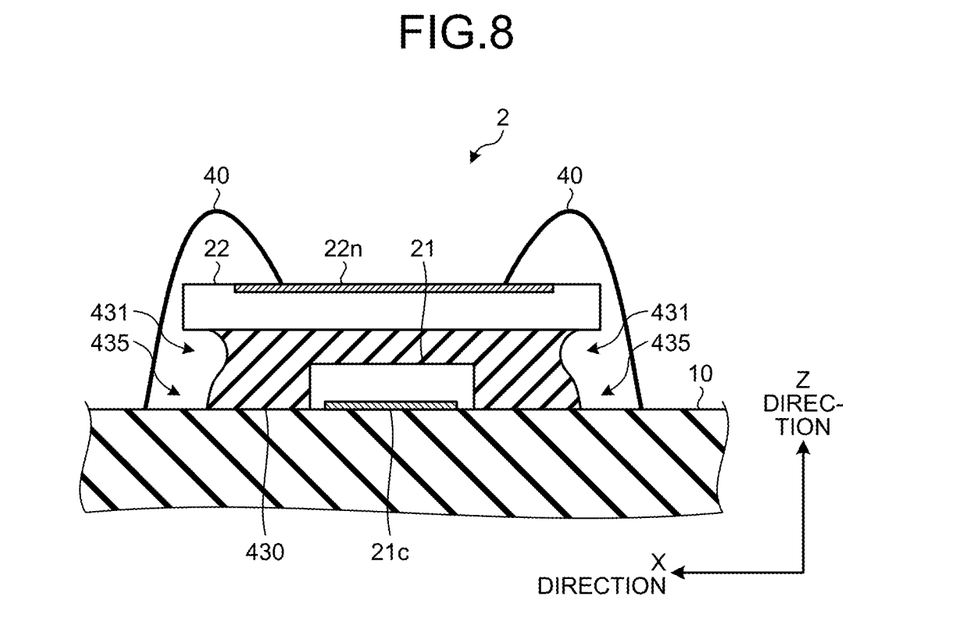
FIG. 8 is an XZ sectional view illustrating an example of the configuration of a semiconductor device according to a second embodiment.

FIG. 8 is an XZ sectional view illustrating an example of the configuration of a semiconductor device 2 according to the second embodiment. Semiconductor chips 21 and 22 may have a substantially square shape when viewed in the Z direction, so that the YZ section of the semiconductor device 2 has a shape similar to the shape of the XZ section illustrated in FIG. 8.

As illustrated in FIG. 8, a resin film 430 included in the semiconductor device 2 has a concave portion 431 and a convex portion 435 on each side face thereof.

For example, the concave portion 431 of the resin film 430 is located directly under the bottom face of the semiconductor chip 22 and has a shape recessed toward an inner region under the bottom face of the semiconductor chip 22 in sectional view of the semiconductor device 2.

The convex portion 435 of the resin film 430 is located under the concave portion 430 at a height where the semiconductor chip 21 is disposed. The convex portion 435 has a shape projecting toward an outer region of the semiconductor chip 22 to the extent that the convex portion 435 does not protrude from the semiconductor chip 22 when viewed in the cross section of the semiconductor device 2.

A projecting amount of the convex portion 435 is smaller than a projecting amount of the convex portion 335 in the resin film 330 of the third modification of the first embodiment described above.

Alternatively, unlike the example of FIG. 8, the resin film 430 of the semiconductor device 2 may not have the convex portion 435 on the side face, but may have, for example, the shape as illustrated in FIGS. 1A and 1B of the first embodiment described above.

In the semiconductor device 2 of the second embodiment, even when a stronger ejection force is applied to the resin film 330 by the semiconductor chip 21 as described in the third modification, the projecting amount of the convex portion 435 of the resin film 430 is reduced by using a manufacturing method described further below.

The volume of the resin film 430 included in the semiconductor device 2 can be represented by, for example, the following formula.

$$Vd_2 = Td \times An - Vc \pm \alpha \qquad (2)$$

$Vd_2$: the volume of the resin film 430
Td: the thickness of the resin film 430
An: the area of the bottom face of the semiconductor chip 22
Vc: the volume of the semiconductor chip 21
$\pm \alpha$: an error range for the volume of the semiconductor chip 21

In this manner, the resin film 430, for example, has a volume equal to the volume obtained by the formula [Td×An−Vc] within the error range±α.

(Method for Manufacturing Semiconductor Device)

Figure 9A:
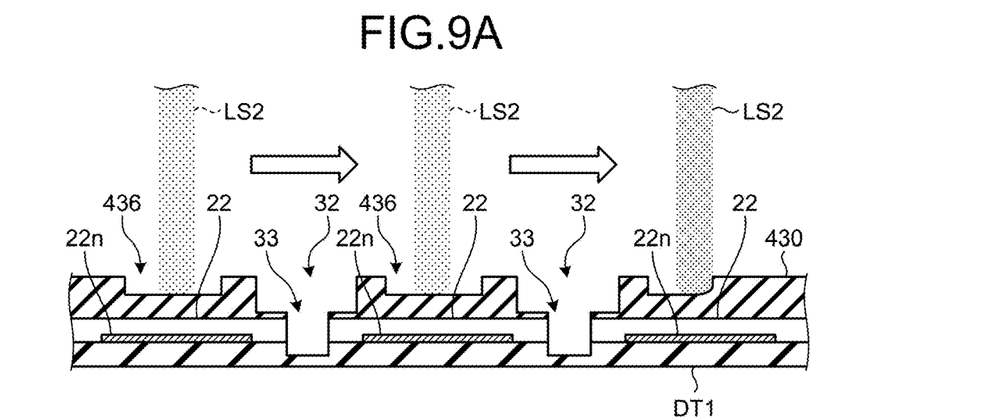
FIGS. 9A to 9C are sectional views in the X direction or the Y direction illustrating, as an example, some of the steps of a method for manufacturing the semiconductor device according to the second embodiment in order.
Figure 9B:
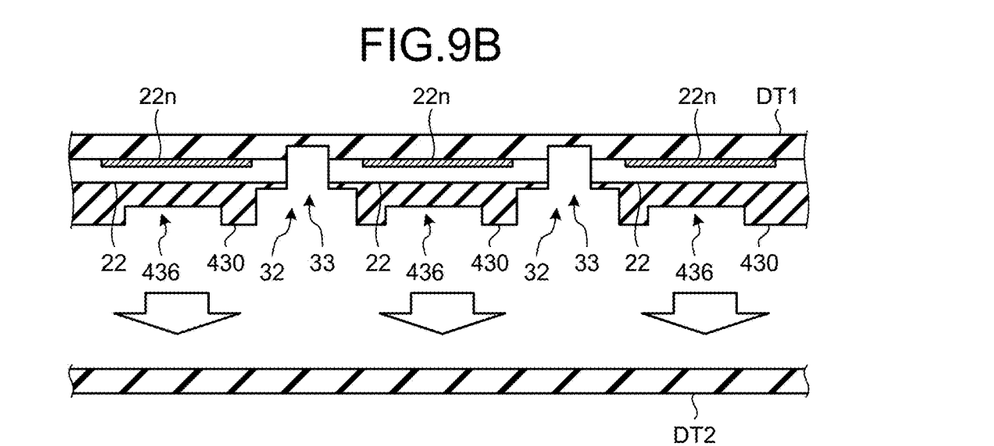
Figure 9C:
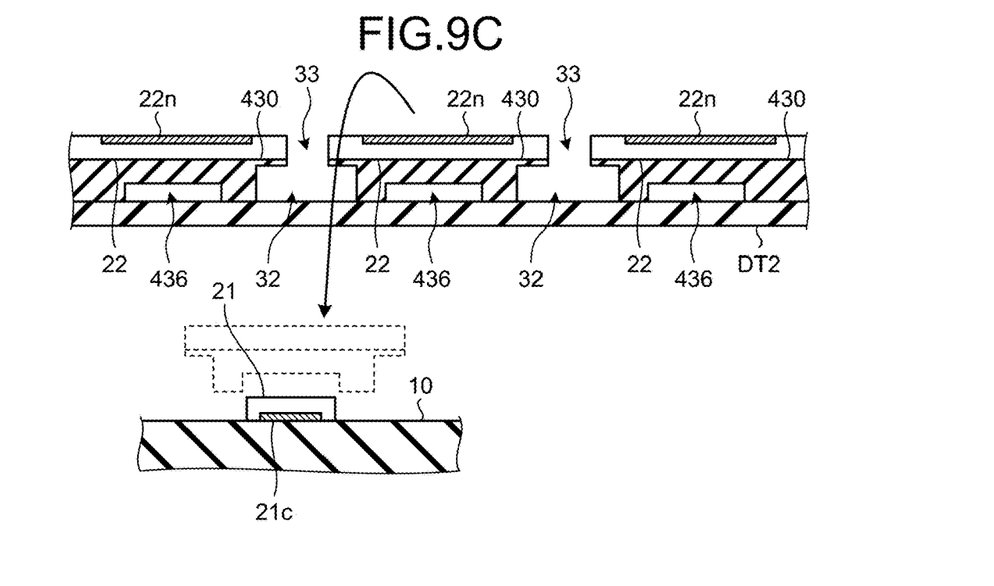

Next, a method for manufacturing the semiconductor device 2 of the second embodiment will be explained with reference to FIGS. 9A to 9C. FIGS. 9A to 9C are sectional views in the X direction or the Y direction illustrating, as an example, some of the steps of the method for manufacturing the semiconductor device 2 according to the second embodiment in order.

The method for manufacturing the semiconductor device 2 of the second embodiment also performs, for example, the steps illustrated in FIGS. 2A to 2D as with the first embodiment described above. FIG. 9A illustrates a state after the steps in FIGS. 2A to 2D are performed.

As illustrated in FIG. 9A, a plurality of cuts 32 and 33 extending in the X direction and the Y direction are formed on the resin film 430, and the resin film 430 is cut for each of the semiconductor chips 22.

For example, laser light LS2 is applied to each resin film 430 processed in this manner to form a recessed portion 436 at a position overlapping the semiconductor chip 22 when viewed in the Z direction where the semiconductor chip 21 is embedded later.

For example, the recessed portion 436 preferably has an area slightly larger than the chip area of the semiconductor chip 21, has a depth slightly shallower than the thickness of the semiconductor chip 21, and has a capacity substantially equal to the volume of the semiconductor chip 21 as a whole.

For example, the depth of focus of the laser light LS2 can be adjusted to form the recessed portion 436 having a desired depth. Also, for example, relatively large diameter laser light is preferably used as the laser light LS2. Accordingly, processing of the recessed portion 436 can be promptly performed.

The recessed portion 436 and the cuts 32 and 33 may be formed in the order different from the order described above. For example, the recessed portion 436 may be formed before the cut 32 is formed. Also, for example, the recessed portion 436 may be formed after the cut 32 is formed and before the cut 33 is formed.

As illustrated in FIG. 9B, the semiconductor chips 22 and the resin films 430 are transferred onto another dicing tape DT2.

As illustrated in FIG. 9C, the semiconductor chips 22 transferred onto the dicing tape DT2 are picked up by a picker or the like and placed on the semiconductor chips 21 mounted on the printed circuit board 10. At this time, the semiconductor chip 22 and the resin film 430 are placed in such a manner that the recessed portion 436 of the resin film 430 stuck to the semiconductor chip 22 overlaps the semiconductor chip 21 on the printed circuit board 10 in the Z direction.

Thereafter, the resin film 430 is heat-cured with the recessed portion 436 of the resin film 430 overlying the semiconductor chip 21 on the printed circuit board 10. The resin film 430 is once softened by heat and firmly sticks to the semiconductor chips 21 and 22, and is then cured while maintaining the firm adhesion state.

At this time, surface tension acts on the softened resin film 430, and a part of the resin film 430 is pushed outward due to the ejection force of the semiconductor chip 21. However, the resin film 430 has the recessed portion 436 having a capacity, for example, substantially equal to the volume of the semiconductor chip 21. Thus, the ejection amount of the resin film 430 at this time is, for example, smaller than that in the third modification of the first embodiment described above.

Also, in forming the recessed portion 436 having a capacity substantially equal to the volume of the semiconductor chip 21, for example, the area of the recessed portion 436 is made larger than the chip area of the semiconductor chip 21 as described above. Accordingly, it is possible to further reduce the amount of the resin film 430 surrounding the semiconductor chip 21, thereby further reducing the ejection amount of the resin film 430 ejected by the semiconductor chip 21.

An excessive capacity caused by increasing the area of the recessed portion 436 is compensated for by making the depth of the recessed portion 436 smaller than the thickness of the semiconductor chip 21 as described above.

A filler such as glass beads may be added to the resin film such as a DAF or a DBF. In such a case, for example, the distribution of the filler contained in the resin film 330 of the third modification of the first embodiment and the distribution of the filler contained in the resin film 430 of the second embodiment may differ from each other. This is because there may be a difference in a flow state of the resin films 330 and 430 pushed out by the semiconductor chip 21 between when the recessed portion 436 is provided and when the recessed portion 436 is not provided.

As described above, when the recessed portion 436 is provided on the resin film 430, the projecting amount of the convex portion 435 is, for example, smaller than that of the convex portion 335 of the third modification of the first embodiment described above in the heat-cured resin film 430. Also, the heat-cured resin film 430 has the volume represented by Formula (2) described above.

In Formula (2), the error range±α may include a processing tolerance of the recessed portion 436, the amount of shrinkage or expansion of the resin film 430 caused by heat curing, or the like.

In this manner, the semiconductor device 2 of the second embodiment is manufactured.

SUMMARY

According to the method for manufacturing the semiconductor device 2 of the second embodiment, the recessed portion 436 having a predetermined depth is formed on the resin film 430 stuck to the semiconductor chip 22, and the resin film 430 is stuck to the semiconductor chip 21 on the printed circuit board 10 in such a manner that the semiconductor chip 21 on the face of the printed circuit board 10 and the recessed portion 436 of the resin film 430 overlap when viewed in the stacking direction of the semiconductor chips 21 and 22.

Accordingly, for example, it is possible to make the projecting amount of the convex portion 435 of the resin film 430 smaller than that of the convex portion 335 of the third modification of the first embodiment described above. Thus, it is possible to more reliably prevent the resin film 430 from protruding from the semiconductor chip 22.

According to the method for manufacturing the semiconductor device 2 of the second embodiment, the recessed portion 436 has an area larger than the chip area of the semiconductor chip 21 when viewed in the stacking direction of the semiconductor chips 21 and 22.

Accordingly, it is possible to reduce the amount of the resin film 430 surrounding the semiconductor chip 21, thereby reducing the ejection amount of the resin film 430 ejected by the semiconductor chip 21.

According to the method for manufacturing the semiconductor device 2 of the second embodiment, the recessed portion 436 has a depth shorter than the thickness of the semiconductor chip 21. Accordingly, it is possible to compensate for an excessive capacity of the recessed portion 436 caused by making the area of the recessed portion 436 larger than the chip area of the semiconductor chip 21 and thus make the capacity of the recessed portion 436 substantially equal to the volume of the semiconductor chip 21.

According to the method for manufacturing the semiconductor device 2 of the second embodiment, the recessed portion 436 has a capacity equal to the volume of the semiconductor chip 21 within a predetermined error range. Accordingly, it is possible to reduce the ejection amount of the resin film 430 ejected by the semiconductor chip 21 to substantially zero and ensure a sufficient amount of the resin film 430 to more reliably cover the semiconductor chip 21.

In addition, the method for manufacturing the semiconductor device 2 of the second embodiment achieves effects similar to the effects achieved by the semiconductor device 1 and the manufacturing method thereof of the first embodiment.

In the first and second embodiments and the first to third modifications described above, the semiconductor device includes the plurality of semiconductor chips on each of which the corresponding one of the nonvolatile memory and the control circuit is mounted. However, the combination of semiconductor chips included in the semiconductor device is not limited thereto.

For example, the semiconductor device may include a plurality of semiconductor chips having different chip areas on each of which the corresponding one of a logic circuit and a semiconductor circuit associated with the logic circuit is mounted. The configurations of the first and second embodiments and the first to third modifications described above can also be applied to such a semiconductor device.

Also, regardless of whether the semiconductor device is a memory semiconductor device or a logic semiconductor device, the combination of the number of semiconductor chips stuck on the resin film and the number of semiconductor chips embedded in the resin film is any combination such as one-to-one or one-to-many.

Also, in the first and second embodiments and the first to third modifications described above, the semiconductor device includes the printed circuit board 10. However, a circuit board on which the semiconductor chip is mounted is not limited to a printed circuit board. The circuit board of the semiconductor device may be, for example, a silicon substrate or a glass substrate on which wiring is formed, or various substrates having a rewiring layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a circuit board;
   a first semiconductor chip mounted on a face of the circuit board;
   a resin film covering the first semiconductor chip; and
   a second semiconductor chip having a chip area larger than a chip area of the first semiconductor chip, the second semiconductor chip being stuck to an upper face of the resin film and mounted on the circuit board, wherein
   the resin film entirely fits within an inner region of a bottom face of the second semiconductor chip when viewed in a stacking direction of the first and second semiconductor chips,
   the resin film is in contact with the circuit board, and
   when viewed from a first direction that intersects the stacking direction, the resin film has a first width at a first height at which the resin film is in contact with the second semiconductor chip, and a second width at a second height that is above the circuit board and lower than the first height, the second width being smaller than the first width.

2. The semiconductor device according to claim 1, wherein
the resin film has, on a side face of the resin film, a concave portion recessed from the first height toward the second height.

3. The semiconductor device according to claim 2, wherein
a recessed amount of the concave portion is maximum near a center of an edge of the second semiconductor chip.

4. The semiconductor device according to claim 2, wherein
the second semiconductor chip has
a first edge extending in the first direction, and
a second edge extending in a second direction intersecting the stacking direction and the first direction, the second edge being longer than the first edge, and
the resin film has
a first concave portion on a side face extending along the first edge, and
a second concave portion on the side face extending along the second edge, the second concave portion being more recessed than the first concave portion toward the inner region.

5. The semiconductor device according to claim 1, wherein
the resin film covers the entirety of the bottom face of the second semiconductor chip.

6. The semiconductor device according to claim 1, wherein
a volume of the resin film is smaller than a volume obtained by a formula [Td×An], where Td denotes a thickness of the resin film, and An denotes an area of the bottom face of the second semiconductor chip.

7. The semiconductor device according to claim 6, wherein
the volume of the resin film is within a predetermined range including a volume obtained by a formula [Td×An−Vc], where Vc denotes a volume of the first semiconductor chip.

8. The semiconductor device according to claim 1, wherein
a nonvolatile memory is mounted on the second semiconductor chip, and
a control circuit that controls operation of the nonvolatile memory is mounted on the first semiconductor chip.

9. The semiconductor device according to claim 1, further comprising
a bonding wire that electrically connects the second semiconductor chip and the circuit board to each other.

10. A semiconductor device manufacturing method comprising:
mounting a first semiconductor chip on a face of a circuit board;
sticking, to a dicing tape, a plurality of second semiconductor chips singulated in such a manner that each of the second semiconductor chips has a chip area larger than a chip area of the first semiconductor chip, each of the second semiconductor chips having a semiconductor element, at a predetermined spacing with a face having the semiconductor element facing down;
sticking a resin film having adhesiveness on a face of each of the second semiconductor chips stuck to the dicing tape, the face of each of the second semiconductor chips being opposite to the face having the semiconductor element;
forming a first cut having a first width larger than the predetermined spacing and a first depth on the resin film at a position corresponding to each boundary portion between the second semiconductor chips;
forming a second cut having a width substantially equal to the predetermined spacing on the resin film remaining on a bottom of the first cut at a position overlapping the boundary portion between the second semiconductor chips when viewed in a stacking direction of the second semiconductor chip and the resin film to cut the resin film in a thickness direction;
sticking the resin film having the first and second cuts to another dicing tape different from the dicing tape and transferring the second semiconductor chip onto the other dicing tape from the dicing tape; and
sticking the resin film having the first and second cuts to the first semiconductor chip on the circuit board and transferring the second semiconductor chip onto the circuit board having the second semiconductor chip from the other dicing tape so as to mount the second semiconductor chip on the circuit board at a position overlapping the first semiconductor chip when viewed in a stacking direction of the first and second semiconductor chips, wherein
in mounting the second semiconductor chip on the circuit board, the second semiconductor chip transferred onto the other dicing tape is picked up by a picker and mounted on the circuit board.

11. The semiconductor device manufacturing method according to claim 10, further comprising:
forming a recessed portion having a second depth on the resin film stuck to the second semiconductor chip at a position overlapping the second semiconductor chip when viewed in the stacking direction of the second semiconductor chip and the resin film, wherein
in mounting the second semiconductor chip on the circuit board,
the resin film is stuck to the first semiconductor chip on the circuit board in such a manner that the first semiconductor chip on the face of the circuit board and the recessed portion of the resin film overlap when viewed in the stacking direction of the first and second semiconductor chips.

12. The semiconductor device manufacturing method according to claim 11, wherein
the recessed portion has an area larger than the chip area of the first semiconductor chip when viewed in the stacking direction of the first and second semiconductor chips.

13. The semiconductor device manufacturing method according to claim 12, wherein
the recessed portion has a depth shallower than a thickness of the first semiconductor chip.

14. The semiconductor device manufacturing method according to claim 11, wherein
the recessed portion has a capacity equal to a volume of the first semiconductor chip within a predetermined error range.

15. The semiconductor device manufacturing method according to claim 14, wherein
the error range includes a processing tolerance of the recessed portion.

16. The semiconductor device manufacturing method according to claim 10, wherein
the second semiconductor chip has
a first edge extending in a first direction intersecting the stacking direction, and a second edge extending in a second direction intersecting the stacking direction and the first direction, the second edge being longer than the first edge, and in forming the first cut, a third cut having a second width larger than the predetermined spacing and the first depth is formed on the resin film at a position corresponding to a boundary portion where the plurality of second semiconductor chips are adjacent to each other at the first edges, and a fourth cut having a third width larger than the second width and the first depth is formed on the resin film at a position corresponding to a boundary portion where the plurality of second semiconductor chips are adjacent to each other at the second edges.

17. The semiconductor device manufacturing method according to claim 10, wherein, in mounting the second semiconductor chip on the circuit board, the resin film is heat-cured so as to cover the first semiconductor chip with the resin film.

18. The semiconductor device manufacturing method according to claim 10, wherein a dicing saw is used to form the first cut, and laser light is used to form the second cut.

19. The semiconductor device manufacturing method according to claim 10, wherein in mounting the second semiconductor chip on the circuit board, the second semiconductor chip and the circuit board are connected to each other through a bonding wire.

20. A semiconductor device comprising:

a circuit board;

a first semiconductor chip mounted on a face of the circuit board;

a resin film covering the first semiconductor chip; and a second semiconductor chip having a chip area larger than a chip area of the first semiconductor chip, the second semiconductor chip being stuck to an upper face of the resin film and mounted on the circuit board, wherein the resin film entirely fits within an inner region of a bottom face of the second semiconductor chip when viewed in a stacking direction of the first and second semiconductor chips, the second semiconductor chip has a first edge extending in a first direction intersecting the stacking direction, and a second edge extending in a second direction intersecting the stacking direction and the first direction, the second edge being longer than the first edge, and the resin film has a first concave portion, on a side face extending along the first edge, recessed toward the inner region when viewed in the first direction, and a second concave portion, on the side face extending along the second edge, recessed toward the inner region when viewed in the first direction, the second concave portion being more recessed than the first concave portion toward the inner region.

* * * * *